United States Patent
Luo et al.

(10) Patent No.: US 11,307,688 B2
(45) Date of Patent: Apr. 19, 2022

(54) THERMAL TRANSFER SUBSTRATE, TOUCH DISPLAY PANEL AND MANUFACTURING METHODS THEREFOR, AND DISPLAY DEVICE

(71) Applicants: Chengdu BOE Optoelectronics Technology Co., Ltd., Sichuan (CN); BOE Technology Group Co., Ltd., Beijing (CN)

(72) Inventors: Hongqiang Luo, Beijing (CN); Jianjun Wu, Beijing (CN)

(73) Assignees: CHENGDU BOE OPTOELECTRONICS TECHNOLOGY CO., LTD, Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 47 days.

(21) Appl. No.: 16/753,358

(22) PCT Filed: Mar. 19, 2019

(86) PCT No.: PCT/CN2019/078696
§ 371 (c)(1),
(2) Date: Apr. 3, 2020

(87) PCT Pub. No.: WO2019/179431
PCT Pub. Date: Sep. 26, 2019

(65) Prior Publication Data
US 2020/0333907 A1    Oct. 22, 2020

(30) Foreign Application Priority Data
Mar. 20, 2018    (CN) .......................... 201810231211.4

(51) Int. Cl.
G06F 3/045    (2006.01)
G06F 3/041    (2006.01)
(Continued)

(52) U.S. Cl.
CPC .......... *G06F 3/0412* (2013.01); *B32B 37/025* (2013.01); *G06F 3/044* (2013.01);
(Continued)

(58) Field of Classification Search
USPC ................... 345/173, 174, 204–207; 257/40
See application file for complete search history.

(56) References Cited

U.S. PATENT DOCUMENTS

2006/0027804 A1\* 2/2006 Yamazaki ......... H01L 21/02425
                                                           257/59
2010/0066683 A1    3/2010 Chang et al.
(Continued)

FOREIGN PATENT DOCUMENTS

CN    101676845 A    3/2010
CN    104503628 A    4/2015
(Continued)

OTHER PUBLICATIONS

International search report of PCT application No. PCT/CN2019/078696 dated May 29, 2019.
First office action of Chinese application No. 201810231211.4 dated Sep. 2, 2019.

*Primary Examiner* — Thuy N Pardo
(74) *Attorney, Agent, or Firm* — Fay Sharpe LLP

(57) ABSTRACT

Disclosed is a thermal transfer substrate including a base substrate and a touch module on the base substrate. A side of the touch module which is in contact with the base substrate is adhesive, the adhesiveness decreasing under a first condition while increasing under a second condition. The present disclosure solves the problem that the manufacturing yield rate of touch display panels is relatively low, and improves the manufacturing yield rate of the touch display panels. The present disclosure is used for manufacturing a touch display panel.

19 Claims, 7 Drawing Sheets

(51) Int. Cl.
- *B32B 37/00* (2006.01)
- *G06F 3/044* (2006.01)
- *H01L 27/32* (2006.01)
- *H01L 51/00* (2006.01)
- *H01L 51/52* (2006.01)
- *H01L 51/56* (2006.01)

(52) U.S. Cl.
CPC ........ *H01L 27/323* (2013.01); *H01L 27/3244* (2013.01); *H01L 51/003* (2013.01); *H01L 51/0097* (2013.01); *H01L 51/5253* (2013.01); *H01L 51/56* (2013.01); *B32B 2310/0831* (2013.01); *B32B 2310/0843* (2013.01); *B32B 2457/208* (2013.01); *G06F 2203/04102* (2013.01); *G06F 2203/04103* (2013.01); *H01L 2227/323* (2013.01); *H01L 2251/5338* (2013.01)

(56) References Cited

U.S. PATENT DOCUMENTS

| | | | | |
|---|---|---|---|---|
| 2014/0175413 | A1* | 6/2014 | Inoue | H01L 51/5016 257/40 |
| 2015/0370395 | A1 | 12/2015 | Hsu et al. | |
| 2017/0012232 | A1* | 1/2017 | Kataishi | H05B 33/14 |
| 2017/0213991 | A1* | 7/2017 | Uesaka | H01L 51/5218 |
| 2018/0039125 | A1* | 2/2018 | Kubota | G02F 1/134363 |
| 2018/0207910 | A1* | 7/2018 | Murashige | B32B 17/1099 |
| 2020/0006699 | A1* | 1/2020 | Ma | B32B 37/14 |
| 2020/0067011 | A1* | 2/2020 | Kim | H01L 27/3262 |

FOREIGN PATENT DOCUMENTS

| | | |
|---|---|---|
| CN | 105446508 A | 3/2016 |
| CN | 105589584 A | 5/2016 |
| CN | 206541282 U | 10/2017 |
| CN | 108415604 A | 8/2018 |

* cited by examiner

THERMAL TRANSFER SUBSTRATE, TOUCH DISPLAY PANEL AND MANUFACTURING METHODS THEREFOR, AND DISPLAY DEVICE

CROSS-REFERENCE TO RELATED APPLICATION

The present application is a 371 of PCT Patent Application No. PCT/CN2019/078696, filed on Mar. 19, 2019, which claims priority to Chinese Patent Application No. 201810231211.4, filed on Mar. 20, 2018 and entitled "MANUFACTURING METHOD OF TOUCH DISPLAY PANEL AND TOUCH DISPLAY PANEL", which is incorporated herein by reference in its entirety.

TECHNICAL FIELD

The present disclosure relates to a thermal transfer substrate, a touch display panel and manufacturing methods therefor, and a display device.

BACKGROUND

With the development of display technologies, flexible displays have become widely used, and the requirements for touch display panels in the flexible displays also become higher and higher.

The touch display panels include outboard touch display panels and embedded touch display panels, wherein the embedded touch display panels are favored because they are light and thin. The embedded touch display panel may be in an on-cell structure, that is, a structure in which a touch module is arranged on a light-emitting device that has been encapsulated. A touch display panel in such on-cell structure may be manufactured by forming a light-emitting device first on a base substrate; then forming a thin film encapsulation (TFE) layer on the light-emitting device; and finally forming a touch module on the TFE layer through at least one patterning process.

SUMMARY

The present disclosure provides a thermal transfer substrate, a touch display panel and manufacturing methods therefor, and a display device. The technical solutions are as follows:

At least one embodiment of the present disclosure provides a thermal transfer substrate. The thermal transfer substrate includes a base substrate and a touch module on the base substrate, wherein a side of the touch module which is in contact with the base substrate is adhesive, and the adhesiveness decreases under a first condition while increases under a second condition.

In one implementation of the embodiments of the present disclosure, the touch module includes a first buffer layer, a support layer and a touch layer which are located on the base substrate in sequence, and the first buffer layer is adhesive.

In one implementation of the embodiments of the present disclosure, the first buffer layer includes a transparent organic thin film.

In one implementation of the embodiments of the present disclosure, the thermal transfer substrate further includes a second buffer layer on the touch module, wherein the second buffer layer is adhesive, and the adhesiveness of the second buffer layer decreases under a third condition.

In one implementation of the embodiments of the present disclosure, a thickness of the second buffer layer is greater than a thickness of the touch module.

In one implementation of the embodiments of the present disclosure, the thickness of the touch module ranges from 6 µm to 8 µm, and the thickness of the second buffer layer is greater than or equal to 50 µm.

In one implementation of the embodiments of the present disclosure, the second buffer layer is an ultraviolet degumming layer.

In one implementation of the embodiments of the present disclosure, the third condition is the same as the second condition.

In one implementation of the embodiments of the present disclosure, the touch module further includes an index matching layer between the support layer and the touch layer.

At least one embodiment of the present disclosure provides a touch display panel. The display panel includes a substrate, and a light-emitting device, a thin film encapsulation layer and a touch module on the substrate, wherein a side of the touch module which is in contact with the thin film encapsulation layer is adhesive, and the adhesiveness decreases under a first condition while increases under a second condition.

In one implementation of the embodiments of the present disclosure, the touch module includes a first buffer layer, a support layer and a touch layer which are located on the thin film encapsulation layer in sequence, and the first buffer layer is adhesive.

In one implementation of the embodiments of the present disclosure, the first buffer layer includes a transparent organic thin film.

At least one embodiment of the present disclosure provides a display device. The display device includes any of the above touch display panels.

At least one embodiment of the present disclosure provides a method of manufacturing a thermal transfer substrate. The method includes:

forming a touch module on a base substrate, wherein a side of the touch module which is in contact with the base substrate is adhesive, and the adhesiveness decreases under a first condition while increases under a second condition.

In one implementation of the embodiments of the present disclosure, forming the touch module on the base substrate includes:

forming a first buffer layer on the base substrate, the first buffer layer being adhesive;

forming a support layer on the first buffer layer; and forming a touch layer on the support layer.

In one implementation of the embodiments of the present disclosure, the method further includes:

forming a second buffer layer on the touch module, the second buffer layer being adhesive, and the adhesiveness of the second buffer layer decreasing under a third condition.

In one implementation of the embodiments of the present disclosure, the third condition is the same as the second condition.

At least one embodiment of the present disclosure provides a method of manufacturing a touch display panel. The method includes:

providing a display panel, which includes a substrate, and a light-emitting device and a thin film encapsulation layer on the substrate;

detaching a touch module on a thermal transfer substrate from a base substrate under a first condition, wherein the thermal transfer substrate includes the base substrate and the touch module on the base substrate, a side of the touch module which is in contact with the base substrate is adhesive, and the adhesiveness decreases under a first condition;

attaching the adhesive side of the touch module to the thin film encapsulation layer; and adhering the touch module to the thin film encapsulation layer under a second condition, the adhesiveness increasing under the second condition.

Optionally, the first condition is laser irradiation, and the second condition is ultraviolet irradiation.

DETAILED DESCRIPTION

Implementations of the present disclosure will be described in further detail with reference to the accompanying drawings, so as to present the objects, technical solutions, and advantages of the present disclosure more clearly.

With the wide applications of flexible displays, the requirements for the manufacturing; yield rate of touch display panels have become higher and higher. The touch display panel in the flexible display is usually of an on-cell structure in which a touch layer in the touch display panel needs to be formed on a thin film encapsulation layer. However, it will cause damage to the thin film encapsulation layer when the manufacturing process of the touch layer is directly performed on the thin film encapsulation layer, resulting in a low manufacturing yield rate of the touch display panel. Embodiments of the present disclosure provide a thermal transfer substrate, a touch display pan& and manufacturing methods therefor, and a display device, which can improve the manufacturing yield rate of the touch display panel.

Figure 1:
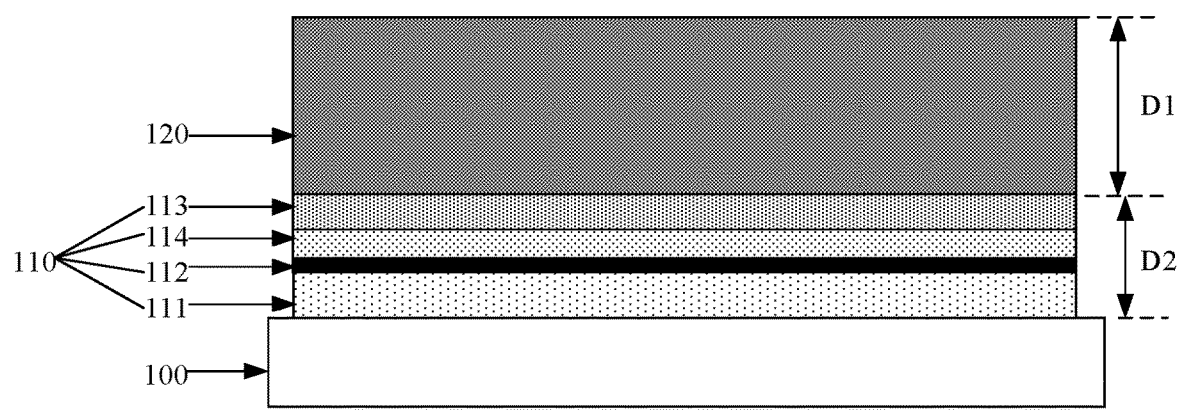
FIG. 1 is a schematic structural diagram of a thermal transfer substrate provided by an embodiment of the present disclosure.

FIG. 1 is a schematic structural diagram of a thermal transfer substrate provided by an embodiment of the present disclosure. Referring to FIG. 1, the thermal transfer substrate includes a base substrate 100 and a touch module 110 on the base substrate 100, wherein a side of the touch module 110 which is in contact with the base substrate 100 is adhesive, and the adhesiveness decreases under a first condition while increases under a second condition.

In the thermal transfer substrate provided by the embodiment of the present disclosure, during the thermal transfer of the touch module on the base substrate, the adhesiveness of the touch module may decrease under the first condition, such that the touch module can be detached from the base substrate. After being detached from the base substrate, the touch module is attached to a thin film encapsulation layer of the display panel, and can be adhered to the thin film encapsulation layer under the second condition. Therefore, in the process of forming the touch module on the display panel by using the thermal transfer substrate, there is no need to directly manufacture the touch module on the thin film encapsulation layer, which prevents the thin film encapsulation layer from being damaged by the etching process during the manufacture of the touch layer. Therefore, the manufacturing yield rate of the touch display panel is relatively high.

Referring to FIG. 1, the touch module 110 may include a first buffer layer 111, a support layer 112 and a touch layer 113, which are located on the base substrate 100 in sequence. The first buffer layer 111 is adhesive, That is, the first buffer layer 111 is located at the side of the touch module 110 which is adhesive.

Exemplarily, the base substrate 100 may be a glass substrate. The first buffer layer 111 may be made of an adhesive transparent insulation material. The adhesiveness of the first buffer layer 111 may be greater than the adhesiveness of other film layers in the touch display panel. In this case, the first buffer layer 111 can be used to adhere the film layers on both sides of the first buffer layer 111. As an example, the first buffer layer 111 may include a transparent organic thin film lift off layer (LOL)), such as a polyimide (PI) thin film.

Exemplarily, the first condition may be laser irradiation. For example, the first buffer layer 111 may be irradiated with laser from the side where the base substrate 100 is located, A focal point of the laser can be controlled to be on a contact surface between the first buffer layer 111 and the base substrate 100. In this way, the portion of the first buffer layer 111 in contact with the base substrate 100 will be melted, and the adhesiveness will decrease, so that the base substrate 100 can be easily separated from the first buffer layer 111. The second condition may be ultraviolet irradiation. For example, the touch module 110 can be irradiated with ultraviolet (UV), and the adhesiveness of the first buffer layer 111 will increase under the irradiation of ultraviolet. Therefore, after the touch module 110 is irradiated with ultraviolet, a first adhesive force between the first buffer layer 111 and the thin film encapsulation layer of the touch display panel will increase, so that the touch module 110 can be firmly attached to the thin film encapsulation layer.

Exemplarily, a thickness of the first buffer layer 111 may range from 2 μm to 4 μm.

Exemplarily, the support layer 112 may be a hardened layer obtained by hard coat processing of an initial material layer. The support layer 112 may be an organic material layer which is relatively hard, so as to support other film layers that are to be formed on the base substrate 100 in subsequent steps. In addition, by providing the support layer 112, display problems caused by damage to the first buffer layer 111 during the formation of the touch layer 113 can be avoided. Meanwhile, the support layer 112 is a transparent film layer, which will not affect the display.

Exemplarily, the touch layer 113 may be a metal thin film layer, and can be formed by at least one patterning process. Each patterning process may include processes such as evaporation or etching. The touch layer 113 may be self-capacitive or mutual-capacitive. In addition, the touch layer 113 may include touch electrode regions and lead wire regions which are arranged alternately.

Optionally, the touch module 110 may further include an index matching (IM) layer 114 between the support layer 112 and the touch layer 113. The IM layer 114 may be made by a sputter process, a plasma enhanced chemical vapor deposition (PECVD) method or the like. The IM layer 114 may be composed of $SiO_2$ and $Nb_2O_5$.

The IM layer 114 is configured to adjust a refractive index of light when the light transmits through the IM layer 114. As such, the brightness of the light emitted from the IM layer 114 can be adjusted, resulting in the light emitted from the touch display panel including the IM layer 114 having an evenly-distributed brightness. In the related art, when the touch display panel displays in a bright state, since the light transmittance of the lead wire regions and the light transmittance of the touch electrode regions in the touch layer are different, the light emitted from the light-emitting device after passing through the touch layer will become uneven in brightness distribution, thereby causing the touch display panel to display light and dark stripes (this is also called a destructive interference phenomenon). In this embodiment of the present disclosure, the IM layer 114 is formed on the first buffer layer 111, and can adjust the brightness of the light emitted from the light-emitting device, such that the brightness distribution of the light emitted from the touch layer will be uniform, thereby preventing the touch display panel from displaying bright and dark stripes when the touch display panel is in the bright state.

Furthermore, in addition to the above-mentioned function of modulating the refractive index, the IM layer 114 may further have the functions of buffering and strengthening the adhesive force between the first buffer layer 111 and the touch layer 113.

Optionally, the thermal transfer substrate may further include a second buffer layer 120 on the touch module 110, the second buffer layer 120 is adhesive, and the adhesiveness of the second buffer layer 120 decreases under a third condition. That is, the second buffer layer 120 may include a material the adhesiveness of which decreases under the third condition.

Exemplarily, a thickness D1 of the second buffer layer 120 may be greater than a thickness D2 of the touch module 110. For example, the thickness of the second buffer layer 120 may be greater than a sum of the thicknesses of the first buffer layer 111, the support layer 112, the touch layer 113 and the IM layer 114. Because the touch module 110 is thin and relatively soft, the second buffer layer 120 can be used as a transfer carrier. For example, the thickness of the touch module 110 may range from 6 μm to 8 μm, and the thickness of the second buffer layer 120 may be greater than or equal to 50 μm. It should be noted that FIG. 1 only schematically shows a thickness relationship among the respective film layers. A thickness ratio of the respective film layers shown in FIG. 1 does not represent a thickness ratio of respective film layers in practical applications.

Exemplarily, the third condition is the same as the second condition. In this way, when the adhesiveness of the adhesive side of the touch module 110 is enhanced, the adhesiveness of the second buffer layer 120 may decrease, thereby facilitating the attachment of the touch module 110 and the separation from the second buffer layer 120 during the thermal transfer process.

As an example, the second buffer layer 120 is an ultraviolet degumming layer. Accordingly, the third condition is ultraviolet irradiation. When the second buffer layer 120 is irradiated with ultraviolet, the adhesiveness of the second buffer layer will decrease. Therefore, after the touch module 110 is irradiated with ultraviolet from the side where the second buffer layer 120 is located, a second adhesive force between the second buffer layer 120 and the touch layer 113 will decrease, and the decreased second adhesive force will be smaller than the increased first adhesive force. As such, when the second adhesive force between the second buffer layer 120 and the touch layer 110 is smaller than the first adhesive force between the first buffer layer 111 and the thin film encapsulation layer, the second buffer layer 120 can be detached from the touch module 110 without separating the touch module 110 from the thin film encapsulation layer.

Figure 2:
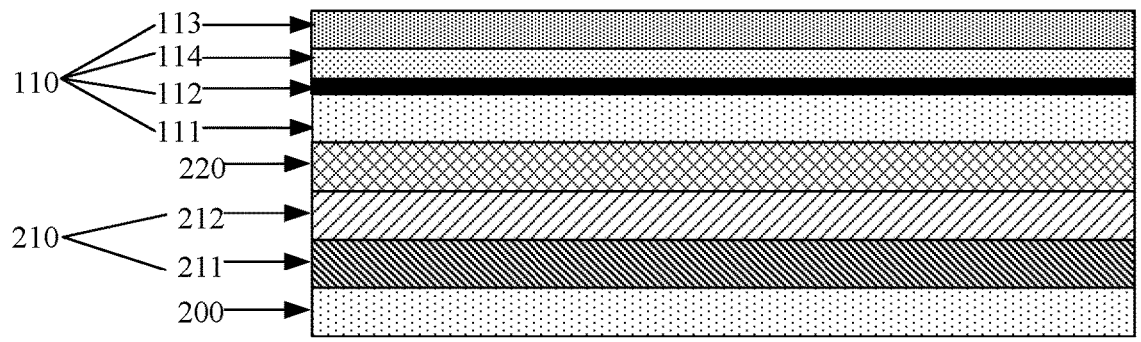
FIG. 2 is a schematic structural diagram of a touch display panel provided by an embodiment of the present disclosure.

FIG. 2 is a schematic structural diagram of a touch display panel provided by an embodiment of the present disclosure. Referring to FIG. 2, the touch display panel includes a substrate 200, and a light-emitting device 210, a thin film encapsulation layer 220 and a touch module 110 on the substrate 200. The touch module 110 is the touch module shown in FIG. 1. A side of the touch module 110 which is in contact with the thin film encapsulation layer 220 is adhesive, and the adhesiveness decreases under a first condition while increases under a second condition.

Exemplarily, the material of the substrate 200 may be PI.

Exemplarily, the touch display panel may be an active-matrix organic light emitting diode (AMOLED) display panel. The touch display panel may be used in any touch display device having a touch display function, such as a mobile phone, a tablet computer, a television, a display, a notebook computer, a digital photo frame, a navigator or the like.

In an AMOLED display panel, the light-emitting device 210 includes a thin film transistor (TFT) layer 211 and an organic light-emitting diode (OLED) layer 212 on the TFT layer 211.

In this embodiment of the present disclosure, the function of the thin film encapsulation layer 220 is to prevent the light-emitting device 210 from being eroded by moisture and air, so as to realize the encapsulation of the light-emitting device 210. For example, the thin film encapsulation layer 220 may be made of an organic insulation material.

At least one embodiment of the present disclosure provides a display device including the touch display panel according to any one of the aforementioned embodiments. The display device may be any display device having a touch display function, such as a mobile phone, a tablet computer, a television, a display, a notebook computer, a digital photo frame, a navigator, or the like.

Figure 3:
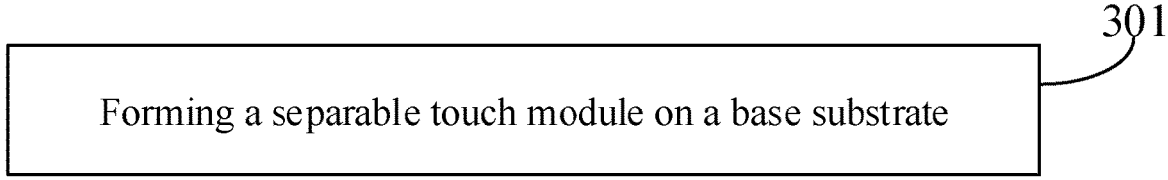
FIG. 3 is a flowchart of a method of manufacturing a thermal transfer substrate provided by an embodiment of the present disclosure.

FIG. 3 is a flowchart of a method of manufacturing a thermal transfer substrate provided by an embodiment of the present disclosure. The method is used to manufacture the thermal transfer substrate shown in FIG. 1. Referring to FIG. 3, the method includes the following steps.

In step 301, a touch module is formed on a base substrate, wherein a side of the touch module which is in contact with the base substrate is adhesive, and the adhesiveness decreases under a first condition while increases under a second condition.

In the thermal transfer substrate provided by the embodiment of the present disclosure, during the thermal transfer of the touch module on the base substrate, the adhesiveness of the touch module may decrease under the first condition, such that the touch module can be detached from the base substrate. After being detached from the base substrate, the touch module is attached to a thin film encapsulation layer of the display panel, and can be adhered to the thin film encapsulation layer under the second condition. Therefore, in the process of forming the touch module on the display panel by using the thermal transfer substrate, there is no need to directly manufacture the touch module on the thin film encapsulation layer, which prevents the thin film encapsulation layer from being damaged by the etching process during the manufacture of the touch layer. Therefore, the manufacturing yield rate of the touch display panel is relatively high.

Figure 4:
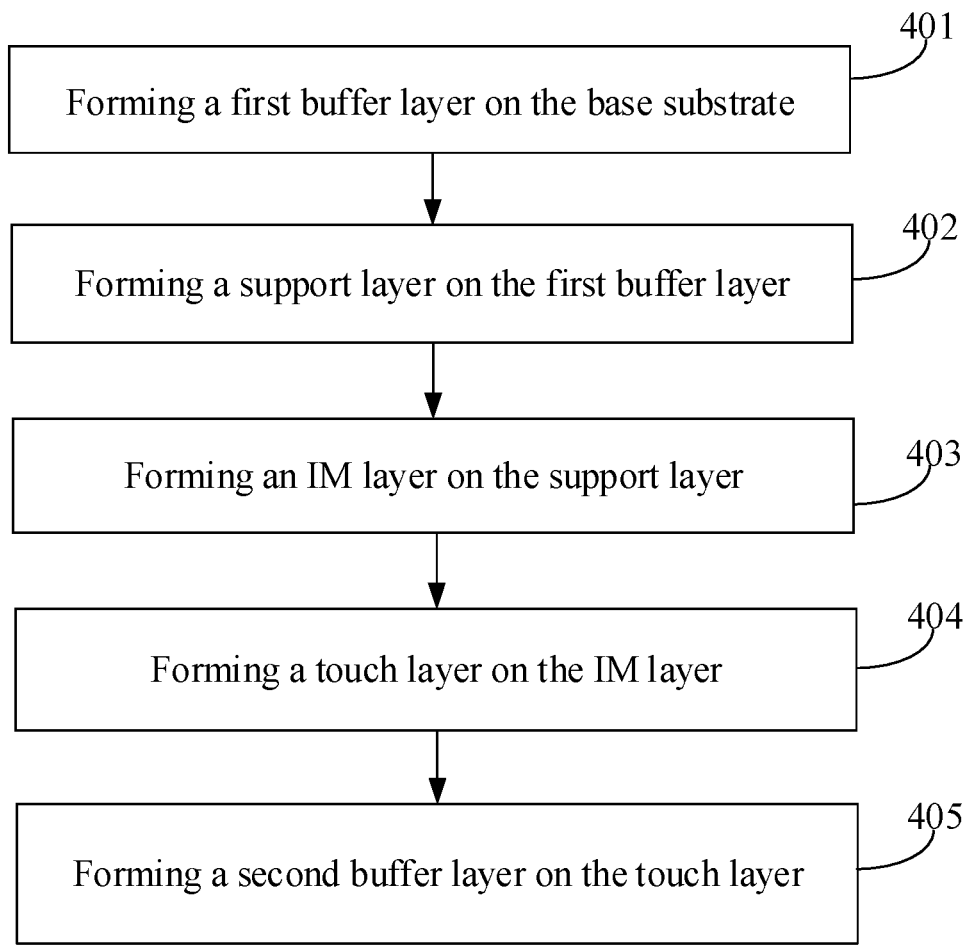
FIG. 4 is a flowchart of a method of manufacturing a thermal transfer substrate provided by an embodiment of the present disclosure.

FIG. 4 is a flowchart of a method of manufacturing a thermal transfer substrate provided by an embodiment of the present disclosure. This method is used to manufacture the thermal transfer substrate shown in FIG. 1. Referring to FIG. 4, the method includes the following steps.

In step 401, a first buffer layer is formed on a base substrate.

Exemplarily, the adhesiveness of the first buffer layer may decrease under the first condition while increase under the second condition. For example, the first condition may be laser irradiation, and the second condition may be ultraviolet irradiation.

Figure 5:
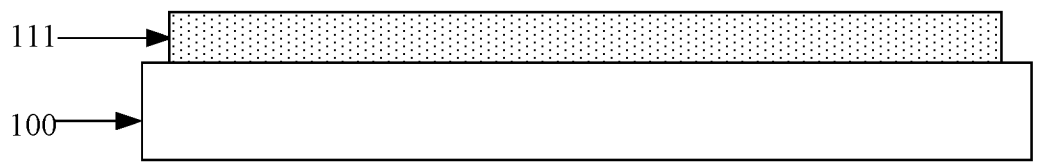
FIG. 5 is a schematic structural diagram showing a first buffer layer has been formed as provided by an embodiment of the present disclosure.

Exemplarily, the first buffer layer 111 can be formed on the base substrate 100 to obtain the structure shown in FIG. 5. The base substrate 100 may be a glass substrate. The first buffer layer 111 may be an adhesive transparent insulation material. The adhesiveness of the first buffer layer 111 may be greater than the adhesiveness of other film layers in the touch display panel. In this case, the first buffer layer 111 can be used to adhere film layers on both sides of the first buffer layer 111. For example, the first buffer layer 111 may include a LOL, such as a PI film.

Exemplarily, the thickness of the first buffer layer may range from 2 μm to 4 μm.

In step 402, a support layer is formed on the first buffer layer.

Figure 6:
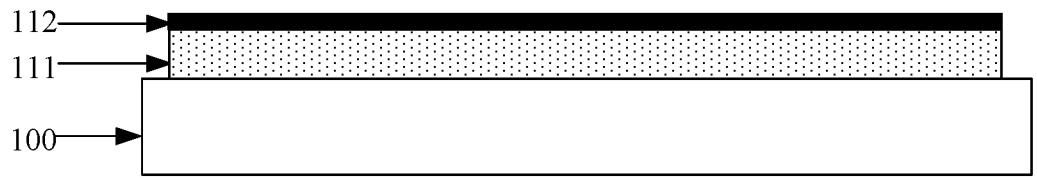
FIG. 6 is a schematic structural diagram showing a support layer has been formed as provided by an embodiment of the present disclosure.

Exemplarily, after the first buffer layer 111 has been formed, an initial material layer may be formed on the first buffer layer 111, and may be subjected to hard coat processing to obtain a hardened layer so as to form the support layer 112, thereby obtaining the structure as shown in FIG. 6. The support layer 112 may be an organic material layer which is relatively hard, so as to support other film layers that are to be formed on the base substrate in the subsequent steps. In addition, by providing the support layer 112, display problems caused by damage to the first buffer layer 111 during the manufacture of the touch layer 113 can be avoided. Meanwhile, the support layer 112 is a transparent film layer, which will not affect the display.

In step 403, an IM layer is formed on the support layer.

Figure 7:
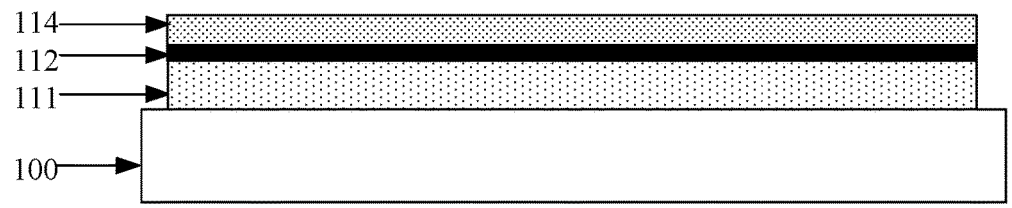
FIG. 7 is a schematic structural diagram showing an IM layer has been formed as provided by an embodiment of the present disclosure.

For example, the IM layer 114 shown in FIG. 7 can be formed on the support layer 112 shown in FIG. 6 by a method such as a sputtering process, a PECVD method or the like. The IM layer 114 may be composed of $SiO_2$ and $Nb_2O_5$. The IM layer may be configured to adjust the refractive index of light rays when the light rays transmit through the IM layer. As such, the brightness of the light emitted from the IM layer can be adjusted, resulting in the light rays emitted from the touch display panel including the IM layer having an evenly-distributed brightness.

In the related art, when the touch display panel displays in a bright state, since the light transmittance of the lead wire regions and the light transmittance of the touch electrode regions in the touch layer are different, the light emitted from the light-emitting device after passing through the touch layer will become uneven in brightness distribution, thereby causing the touch display panel to display light and dark stripes (this is also called a destructive interference phenomenon). In this embodiment of the present disclosure, the IM layer is formed on the first buffer layer, and can adjust the brightness of the light emitted from the light-emitting device, such that the brightness distribution of the light emitted from the touch layer will be uniform, thereby preventing the touch display panel from displaying bright and dark stripes when the touch display panel is in the bright state.

In step 404, a touch layer is formed on the IM layer.

Exemplarily, the touch layer 113 may be a metal thin film layer. The touch layer 113 may be self-capacitive or mutual-capacitive. In addition, the touch layer 113 may include touch electrode regions and lead wire regions which are arranged alternately.

Figure 8:
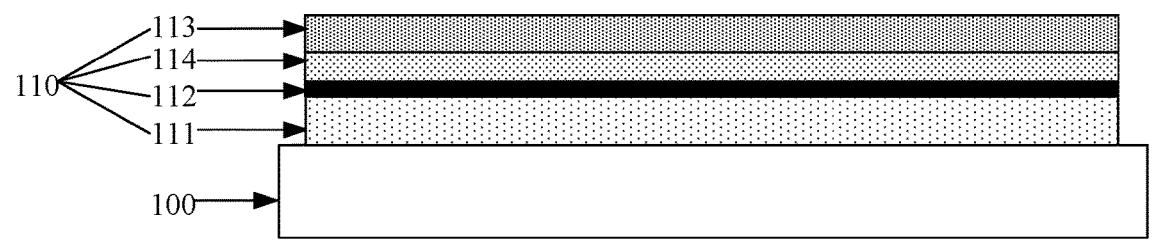
FIG. 8 is a schematic structural diagram showing a touch layer has been formed as provided by an embodiment of the present disclosure.

Exemplarily, the touch layer 113 can be formed on the IM layer 114 shown in FIG. 7 through at least one patterning process to obtain the structure shown in FIG. 8. Each patterning process may include processes such as evaporation or etching.

In step 405, a second buffer layer is formed on the touch layer.

Exemplarily, the second buffer layer 120 is adhesive, and the adhesiveness of the second buffer layer 120 decreases under a third condition. That is, the second buffer layer 120 may include a material of which the adhesiveness decreases under the third condition. For example, the third condition may be the same as the second condition.

Figure 9:
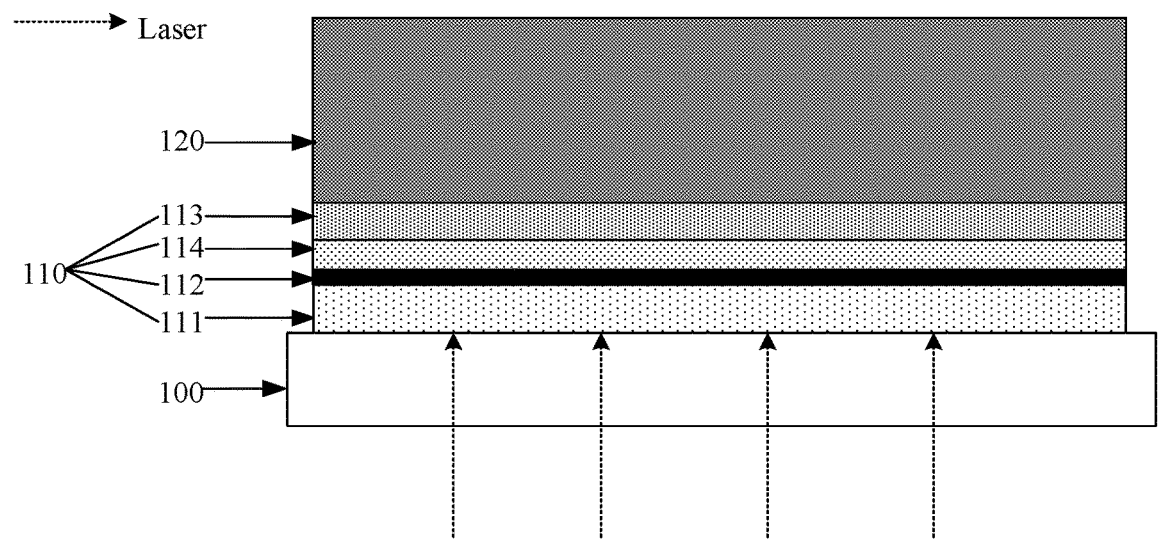
FIG. 9 is a schematic structural diagram showing a second buffer layer has been formed as provided by an embodiment of the present disclosure.

Exemplarily, a second buffer layer 120 may be formed on the touch layer 113 shown in FIG. 8 to obtain the structure shown in FIG. 9. The thickness of the second buffer layer 120 may be greater than the thickness of the touch module 110. For example, the thickness of the second buffer layer 120 may be greater than a sum of the thicknesses of the first buffer layer 111, the support layer 112, the touch layer 113 and the IM layer 114. As the touch module 110 as mentioned above is thin and relatively soft, the second buffer layer 120 can be used as a transfer carrier. For example, the thickness of the touch module 110 may range from 6 μm to 8 μm, and the thickness of the second buffer layer 120 may be greater than or equal to 50 μm.

Exemplarily, the second buffer layer 120 is an ultraviolet degumming, layer.

In the above steps, steps 403 and 405 are optional steps.

Figure 10:
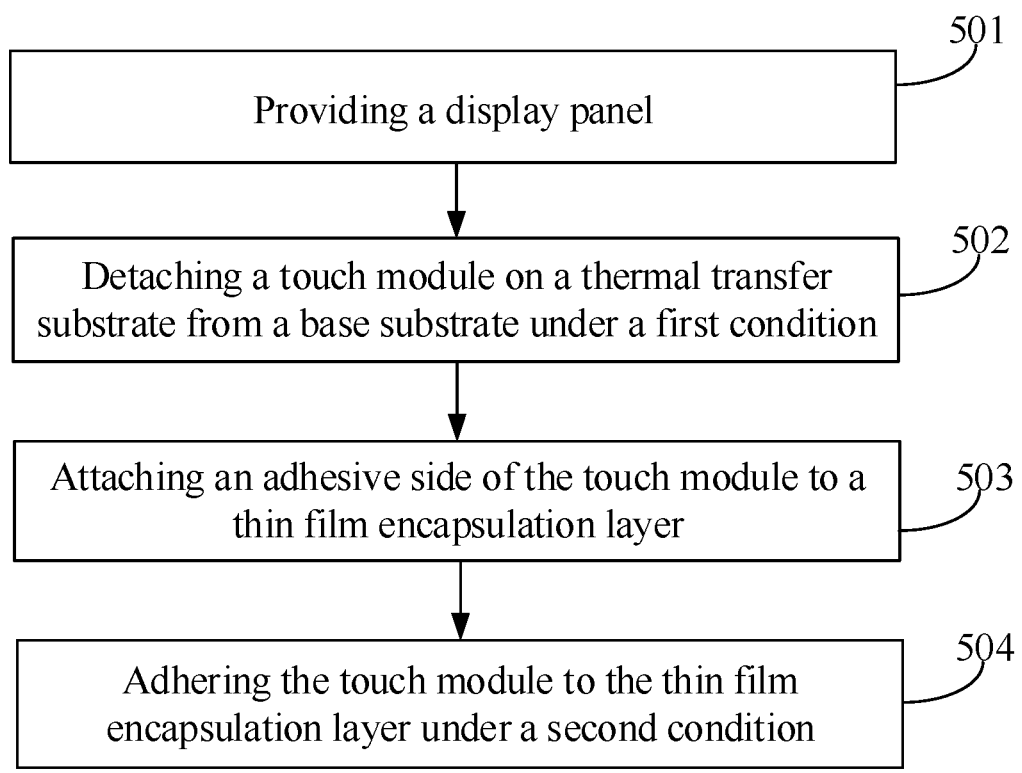
FIG. 10 is a flowchart of a method of manufacturing a touch display panel provided by an embodiment of the present disclosure.

FIG. 10 is a flowchart of a method of manufacturing a touch display panel provided by an embodiment of the present disclosure. This method is used to manufacture the touch display panel shown in FIG. 2. As shown in FIG. 10, the method includes the following steps.

In step 501, a display panel is provided.

The display panel includes a substrate, and a light-emitting device and a thin film encapsulation layer on the substrate.

Exemplarily, the material of the substrate may be PI.

In this embodiment of the present disclosure, the function of the thin film encapsulation layer is to prevent the light-emitting device from being eroded by moisture and air, so as to realize the encapsulation of the light-emitting device. For example, the thin film encapsulation layer may be made of an organic insulation material.

In step 502, the touch module on the thermal transfer substrate is detached from the base substrate under the first condition.

The touch module is a touch module in the thermal transfer substrate manufactured by the method shown in FIG. 4. The thermal transfer substrate includes a base substrate and a touch module on the base substrate. A side of the touch module which is in contact with the base substrate is adhesive, and the adhesiveness decreases under the first condition.

In step 503, the side of the touch module which is adhesive is attached to the thin film encapsulation layer.

The adhesiveness increases under the second condition.

In step 504, the touch module is adhered to the thin film encapsulation layer under the second condition.

In summary, in the method of manufacturing the touch display panel provided by the embodiment of the present disclosure, the light-emitting device and the thin film encapsulation layer can be formed on the substrate to obtain the display panel, and the touch module can formed on the base substrate. Then the touch module can be detached from the base substrate and attached to the thin film encapsulation layer. There is no need to directly manufacture the touch module on the thin film encapsulation layer, which prevents the thin film encapsulation layer from being damaged by the etching process during the manufacture of the touch layer. Therefore, the manufacturing yield rate of the touch display panel is relatively high.

Figure 11:
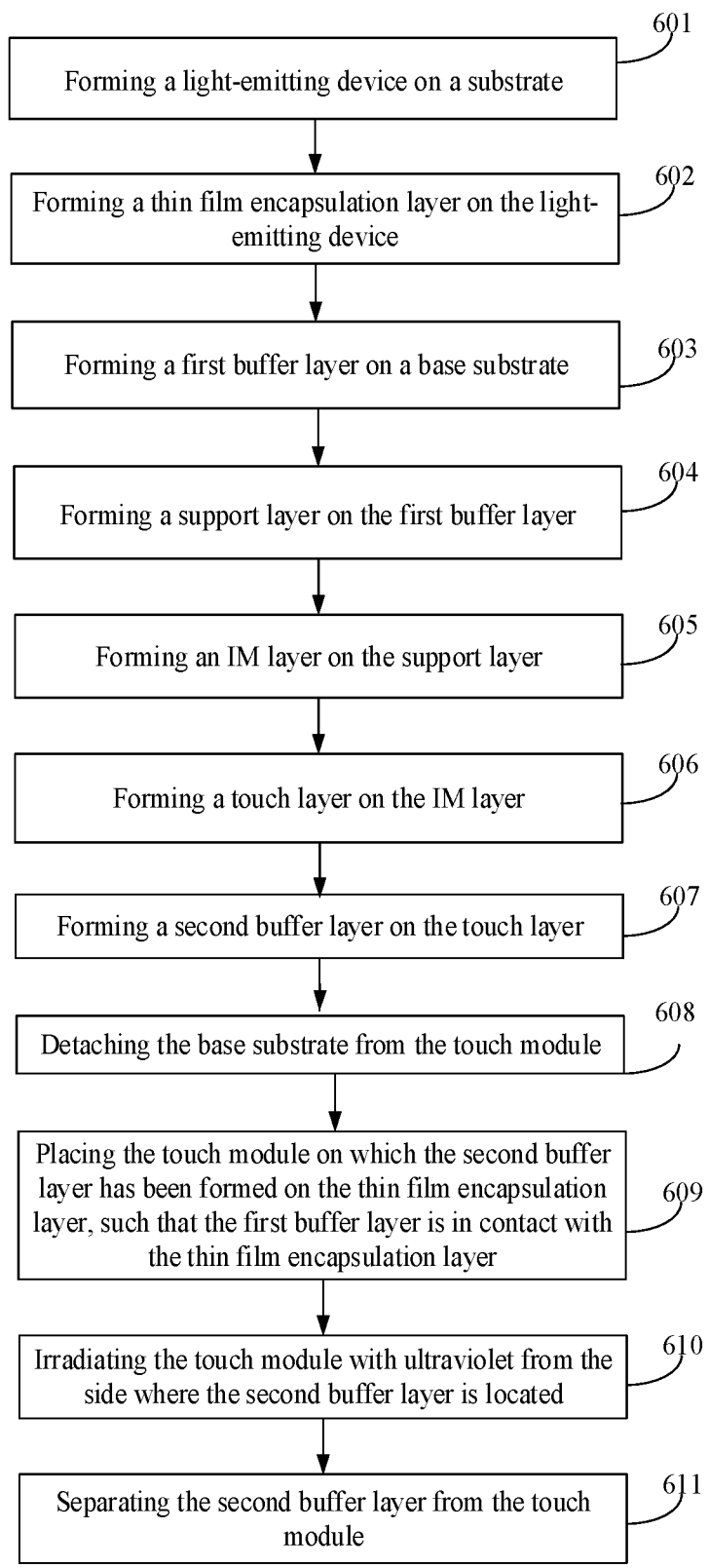
FIG. 11 is a flowchart of a method of manufacturing a touch display panel provided by an embodiment of the present disclosure.

FIG. 11 is a flowchart of a method of manufacturing a touch display panel provided by an embodiment of the present disclosure. This method is used to manufacture the touch display panel shown in FIG. 2. As shown in FIG. 11, the method includes the following steps.

In step 601, a light-emitting device is formed on a substrate.

Figure 12:
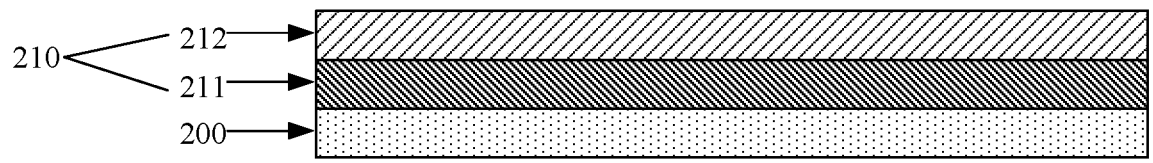
FIG. 12 is a partial structural schematic diagram of a touch display panel provided by an embodiment of the present disclosure.

Exemplarily, a TFT layer 211 may be first formed on the substrate. An OLED layer 212 may be then formed on the TFT layer 211, The TFT layer 211 and the OLED layer 212 constitute a light-emitting, device 210 to obtain the structure shown in FIG. 12. The material of the substrate 200 may be PI.

In step 602, a thin film encapsulation layer is formed on the light-emitting device.

In order to prevent the light-emitting device 210 from being eroded by moisture and air, the light-emitting device 210 needs to be encapsulated. By forming a thin film encapsulation layer on the light-emitting device, a display panel may be obtained. Exemplarily, the thin film encapsulation layer 220 can be formed on the light-emitting device 210 shown in FIG. 12 to obtain the structure shown in FIG. 13.

In step 603, a first buffer layer is formed on the base substrate.

Exemplarily, the adhesiveness of the first buffer layer may decrease under the first condition while increase under the second condition. For example, the first condition may be laser irradiation, and the second condition may be ultraviolet irradiation.

Exemplarily, a first buffer layer 111 can be formed on the base substrate 100 to obtain the structure shown in FIG. 5. The base substrate 100 and the substrate 200 are two mutually independent substrates. The base substrate 100 may be a glass substrate. The first buffer layer 111 may be an adhesive transparent insulation material. The adhesiveness of the first buffer layer may be greater than the adhesiveness of other film layers in the touch display panel. In this case, the first buffer layer can be used to adhere the film layers on both sides of the first buffer layer. As an example, the first buffer layer may be LOL, such as a PI thin film, and the thickness of the first buffer layer may range from 2 μm to 4 μm.

In step 604, a support layer is formed on the first buffer layer.

Exemplarily, after the first buffer layer 111 has been formed, an initial material layer may be formed on the first buffer layer 111, and may be subjected to hard coat processing to obtain a hardened layer so as to form the support layer 112, thereby obtaining the structure as shown in FIG. 6. The support layer 112 may be an organic material layer which is relatively hard, so as to support other film layers that are to be formed on the base substrate in the subsequent steps. In addition, by providing the support layer 112, the display problems caused by damage to the first buffer layer 111 during the formation of the touch layer 113 can be avoided. Meanwhile, the support layer 112 is a transparent film layer, which will not affect the display.

In step 605, an IM layer is formed on the support layer.

Exemplarily, the IM layer 114 shown in FIG. 7 can formed on the support layer 112 shown in FIG. 6 by a method such as a sputtering process, a PECVD method or the like. The IM layer 114 can be composed of $SiO_2$ and $Nb_2O_5$. The IM layer may be configured to adjust the refractive index of light rays when the light rays transmit through the IM layer. As such, the brightness of the light rays emitted from the IM layer can be adjusted, resulting in the light rays emitted from the touch display panel including the IM layer having an evenly-distributed brightness.

Furthermore, in addition to the above-mentioned function of modulating the refractive index, the IM layer 114 can further have the functions of buffering and strengthening the adhesive force between the first buffer layer 111 and the touch layer 113.

In step 606, a touch layer is formed on the IM layer.

Exemplarily, the touch layer 113 can be formed on the IM layer 114 shown in FIG. 7 through at least one patterning process to obtain the structure shown in FIG. 8. In this case, the first buffer layer 111, the support layer 112, the IM layer 114 and the touch layer 113 can collectively constitute the touch module 110. Each patterning process may include processes such as evaporation or etching.

The touch layer may be self-capacitive or mutual-capacitive. In addition, the touch layer may include touch electrode regions and lead wire regions which are arranged alternately. In the related art, when the touch display panel displays in a bright state, since the light transmittance of the lead wire regions and the light transmittance of the touch electrode regions in the touch layer are different, the light emitted from the light-emitting device after passing through the touch layer will become uneven in brightness distribution, thereby causing the touch display panel to display light and dark stripes (this is also called a destructive interference phenomenon). In this embodiment of the present disclosure, the IM layer is formed on the first buffer layer, and can adjust the brightness of the light emitted from the light-emitting device, such that the brightness distribution of the light emitted from the touch layer will be uniform, thereby preventing the touch display panel from displaying bright and dark stripes when the touch display panel is in the bright state.

In step 607, a second buffer layer is formed on the touch layer.

Exemplarily, the second buffer layer 120 is adhesive, and the adhesiveness of the second buffer layer 120 decreases under a third condition. That is, the second buffer layer 120 includes a material of which the adhesiveness decreases under the third condition. For example, the third condition may be the same as the second condition.

Exemplarily, the second buffer layer 120 can be formed on the touch layer 113 shown in FIG. 8 to obtain the structure shown in FIG. 9. The thickness of the second buffer layer 120 may be greater than a sum of the thicknesses of the touch layer 113, the IM layer 114, the support layer 112 and the first buffer layer 111 (i.e., the thickness of the touch module 110). For example, the thickness of the touch module 110 may range from 6 µm to 8 µm, and the thickness of the second buffer layer 120 may be greater than or equal to 50 µm. It should be noted that FIG. 9 only schematically shows a thickness relationship among the respective film layers. A thickness ratio of the respective film layers shown in FIG. 9 does not represent a thickness ratio of respective film layers in practical applications.

Exemplarily, the second buffer layer 120 is an ultraviolet degumming layer.

In step 608, the base substrate is detached from the touch module.

Exemplarily, refer to FIG. 9 again, the base substrate 100 may be detached from the touch module 110 by using technologies such as laser lift-off (LLO) or the like. For example, the first buffer layer 111 may be irradiated with laser from the side where the base substrate 100 is located. A focal point of the laser can be controlled to be on a contact surface between the first buffer layer 111 and the base substrate 100. In this way, the portion of the first buffer layer 111 in contact with the base substrate 100 will be melted, and the adhesiveness will decrease, so that the base substrate 100 can be easily detached from the first buffer layer 111.

Here, the step of separating the base substrate 100 from the first buffer layer 111 may include: cutting the surface of the base substrate 100 in contact with the first buffer layer 111 with a blade, so that the base substrate 100 is detached from the first buffer layer 111. This is because that, after laser lift-off, the adhesive force between the base substrate 100 and the first buffer layer 111 is smaller, therefore, the base substrate 100 can be easily detached from the first buffer layer 111. Here, by using the blade to separate, the base substrate can not only be detached from the first buffer layer completely, but also the first buffer layer 111 per se would not be damaged. In addition, the flatness of the side where the first buffer layer 111 locates can be maintained, and thus the effect of the subsequent transfer to the display panel can be ensured.

In step 609, the touch module on which the second buffer layer has been formed is placed on the thin film encapsulation layer, so that the first buffer layer is in contact with the thin film encapsulation layer.

Figure 13:
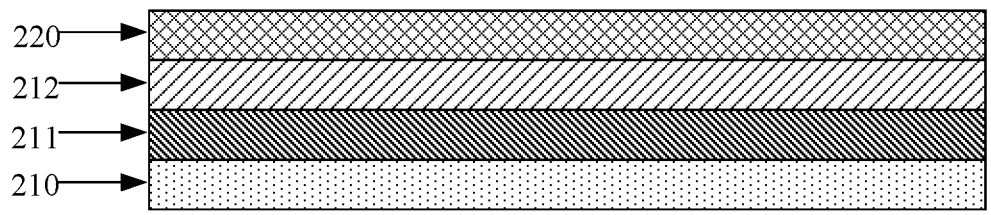
FIG. 13 is a partial structural schematic diagram of a touch display panel provided by an embodiment of the present disclosure.

Exemplarily, the touch module 110 on which the second buffer layer 120 has been formed can be placed on the thin film encapsulation layer 220 shown in FIG. 13, so that the first buffer layer 111 is in contact with the thin film encapsulation layer 220, thereby obtaining the structure shown in FIG. 10. It should be noted that due to the small thickness of the touch module, in step 208, the touch module would not remain intact if it is directly peeled off from the base substrate and moved to the thin film encapsulation layer. Therefore, the second buffer layer with a larger thickness needs to be used as a transfer carrier to transfer the touch module from the base substrate to the thin film encapsulation layer.

Here, the touch module 110 on which the second buffer layer 120 has been formed may be transferred onto the thin film encapsulation layer 220 by a thermal transfer device.

In step 610, the touch module is irradiated with ultraviolet from the side where the second buffer layer is located.

Figure 14:
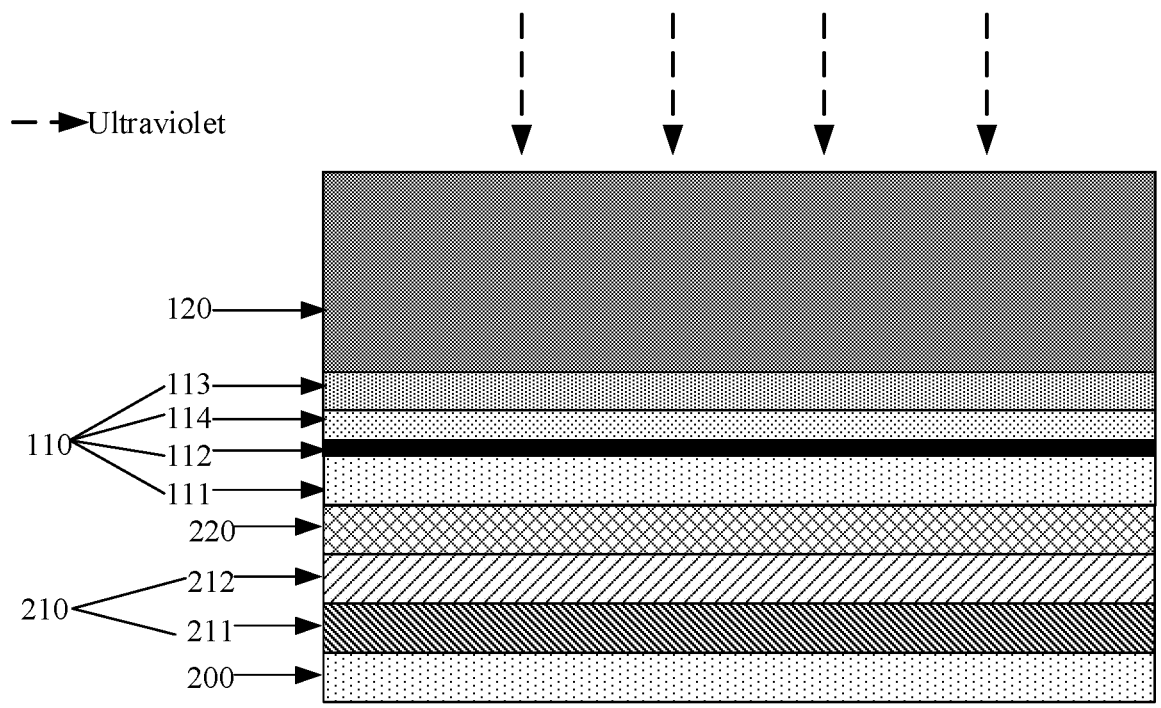
FIG. 14 is a schematic structural diagram showing a touch display panel has been formed provided by an embodiment of the present disclosure.

Exemplarily, continuing to refer to FIG. 14, the touch module 110 may be irradiated with ultraviolet (UV) from the side where the second buffer layer 120 is located. It should be noted that the adhesiveness of the first buffer layer 111 increases under the irradiation of ultraviolet. Therefore, after the touch module 110 is irradiated with UV, the first adhesive force between the first buffer layer 111 and the thin film encapsulation layer 220 will increase, so that the touch module 110 can be firmly attached to the thin film encapsulation layer 220. In addition, the second buffer layer 120 may be an ultraviolet debonding film, and the adhesiveness of the second buffer layer 120 can decrease under the UV irradiation. Therefore, after the touch module 110 is irradiated with UV from the side where the second buffer layer 120 is located, the second adhesive force between the second buffer layer 120 and the touch layer 113 will decrease. In addition, the decreased second adhesive force will be smaller than the increased first adhesive force. Through the above UV irradiation step, not only can the touch module 110 be firmly attached to the thin film encapsulation layer 220, but also the adhesive force between the second buffer layer 120 and the touch layer 113 can decrease to facilitate the subsequent separation, that is, the two effects can be achieved at the same time, thereby saving time and effort.

In step 611, the second buffer layer is separated from the touch module.

Exemplarily, the second buffer layer and the touch layer may be separated by using mechanical equipment to clamp the second buffer layer and apply an external force to pull it, thereby separating the second buffer layer from the touch layer. As the second buffer layer is relatively thick, it is convenient to implement the above operation. In addition, as the second adhesive force between the second buffer layer and the touch layer is smaller than the first adhesive force between the first buffer layer and the thin film encapsulation layer, the second buffer layer can be stripped from the touch module, without separating the touch module from the thin film encapsulation layer, thereby obtaining the touch display panel 00 shown in FIG. 15.

Figure 15:
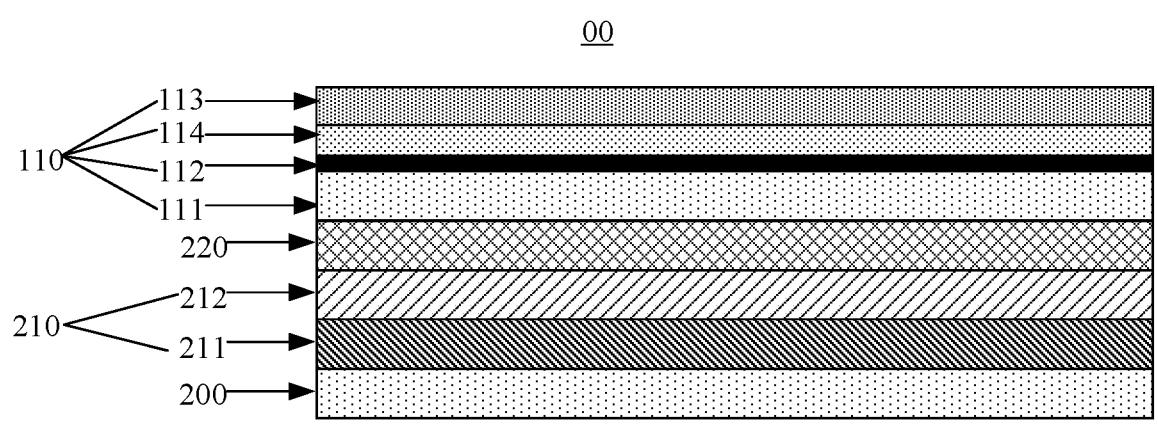
FIG. 15 is a schematic structural diagram of a touch display panel provided by an embodiment of the present disclosure.

When the touch display panel 00 shown in FIG. 15 is formed, the touch layer 113 is exposed, so that the subsequent bonding process of the touch layer and an integrated circuit can be performed normally.

In this embodiment of the present disclosure, the light-emitting device and the thin film encapsulation layer can be first formed on the substrate. Then, the first buffer layer is formed on the base substrate, and the support layer, the IM layer, the touch layer and the second buffer layer are sequentially formed on the first buffer layer. The first buffer layer, the IM layer and the touch layer constitute the touch module. Next, the base substrate is detached from the touch module, and the second buffer layer is used as a transfer carrier to attach the touch module to the thin film encapsulation layer. Finally, the second buffer layer is detached from the touch module to form the touch display panel.

In summary, in the method of manufacturing the touch display panel provided by the embodiment of the present disclosure, the light-emitting device and the thin film encapsulation layer can be formed on the substrate, and the touch module can be formed on the base substrate. Then the touch module is detached from the base substrate and attached to the thin film encapsulation layer. There is no need to directly manufacture the touch module on the thin film encapsulation layer, which prevents the thin film encapsulation layer from being damaged by the etching process during the manufacture of the touch layer. Therefore, the manufacturing yield rate of the touch display panel is relatively high.

It should be noted that mutual references can be made among the embodiments of the thermal transfer substrates and the touch display panels, as well as the corresponding method embodiments provided by the present disclosure, which is not limited in the embodiments of the present disclosure. The sequence of the steps in the method embodiments of the present disclosure can be adjusted appropriately, and the steps can be deleted or added according to the situation. Within the technical scope disclosed in the present disclosure, any variations of the method easily derived by a person of ordinary skill in the art shall fall within the protection scope of the present disclosure, which is not repeated here.

The foregoing descriptions are merely optional embodiments of the present disclosure, and are not intended to limit the present disclosure. Within the spirit and principles of the disclosure, any modifications, equivalent substitutions, improvements, etc., are within the protection scope of the present disclosure.

The invention claimed is:

1. A thermal transfer system, comprising a display panel and a thermal transfer substrate, the display panel comprising a thin film encapsulation layer, the thermal transfer substrate comprising a base substrate and a touch module on the base substrate, wherein a side of the touch module which is in contact with the base substrate is adhesive, and the adhesiveness decreases under a laser irradiation while increases under ultraviolet irradiation; and wherein when the touch module is under the laser irradiation, the touch module is in a state of detaching from the base substrate, and when the touch module is under the ultraviolet irradiation, the touch module is in a state of adhering to the thin film encapsulation layer.

2. The thermal transfer system according to claim 1, wherein the touch module comprises a first buffer layer, a carrier layer and a touch layer which are located on the base substrate in sequence, and the first buffer layer is adhesive.

3. The thermal transfer system according to claim 2, wherein the first buffer layer comprises a transparent organic thin film.

4. The thermal transfer system according claim 1, further comprising a second buffer layer on the touch module, wherein the second buffer layer is adhesive, and the adhesiveness of the second buffer layer decreases under a third condition.

5. The thermal transfer system according to claim 4, wherein a thickness of the second buffer layer is greater than a thickness of the touch module.

6. The thermal transfer system according to claim 4, wherein the thickness of the touch module ranges from 6 µm to 8 µm, and the thickness of the second buffer layer is not less than 50 µm.

7. The thermal transfer system according to claim 4, wherein the third condition is the ultraviolet irradiation.

8. The thermal transfer system according to claim 4, wherein the second buffer layer is an ultraviolet degumming layer.

9. The thermal transfer system according to claim 2, wherein the touch module further comprises an index matching layer between the support layer and the touch layer, wherein the index matching layer is configured to adjust a refractive index of light when the light transmits through the index matching layer.

10. A touch display panel, comprising a substrate, and a light-emitting device, a thin film encapsulation layer and a touch module on the substrate, wherein a side of the touch module which is in contact with the thin film encapsulation layer is adhesive, and the adhesiveness decreases under laser irradiation while increases under ultraviolet irradiation;

wherein when the touch module is under the laser irradiation, the touch module is in a state of detaching from a base substrate of an associated thermal transfer substrate, and when the touch module is under the ultraviolet irradiation, the touch module is in a state of adhering to the thin film encapsulation layer.

11. The touch display panel according to claim 10, wherein the touch module comprises a first buffer layer, a support layer and a touch layer which are located on the thin film encapsulation layer in sequence, and the first buffer layer is adhesive.

12. The touch display panel according to claim 11, wherein the first buffer layer comprises a transparent organic thin film.

13. A display device, comprising the touch display panel according to claim 10.

14. A method of manufacturing a touch display panel, comprising:

providing a display panel, comprising a substrate, and a light-emitting device and a thin film encapsulation layer on the substrate;

detaching a touch module on a thermal transfer substrate from a base substrate under laser irradiation, wherein the thermal transfer substrate comprises the base substrate and the touch module on the base substrate, a side of the touch module which is in contact with the base substrate is adhesive, and the adhesiveness decreases under the laser irradiation;

attaching the adhesive side of the touch module to the thin film encapsulation layer; and adhering the touch module to the thin film encapsulation layer under ultraviolet irradiation, the adhesiveness increasing under the ultraviolet irradiation.

15. The method according to claim 14, comprising:

forming the touch module on the base substrate, to provide the thermal transfer substrate.

16. The method according to claim 15, wherein forming the touch module on the base substrate comprises:

forming a first buffer layer on the base substrate, the first buffer layer being adhesive;

forming a support layer on the first buffer layer; and forming a touch layer on the support layer.

17. The method according to claim 15, further comprising:
  forming a second buffer layer on the touch module, the second buffer layer being adhesive, and the adhesiveness of the second buffer layer decreasing under the ultraviolet irradiation.

18. The method according to claim 17, adhering the touch module to the thin film encapsulation layer under ultraviolet irradiation comprises:
  performing ultraviolet irradiation to decrease the adhesiveness of the second buffer layer to detach the second buffer layer from the touch module and adhere the touch module to the thin film encapsulation layer.

19. The method according to claim 14, wherein providing the display panel, comprises:
  forming the light-emitting device on the substrate; and
  forming the thin film encapsulation layer on the light-emitting device.

\* \* \* \* \*